(12) United States Patent
Ohira

(10) Patent No.: US 9,282,634 B2
(45) Date of Patent: Mar. 8, 2016

(54) PRINTED WIRING BOARD, PRINTED CIRCUIT BOARD, AND PRINTED CIRCUIT BOARD MANUFACTURING METHOD

(71) Applicant: CANON KABUSHIKI KAISHA, Tokyo (JP)

(72) Inventor: Masaharu Ohira, Komae (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 320 days.

(21) Appl. No.: 13/953,496

(22) Filed: Jul. 29, 2013

(65) Prior Publication Data

US 2014/0043783 A1 Feb. 13, 2014

(30) Foreign Application Priority Data

Aug. 8, 2012 (JP) .................. 2012-175887

(51) Int. Cl.
*H05K 7/02* (2006.01)
*H05K 1/11* (2006.01)
*B23K 31/02* (2006.01)
(Continued)

(52) U.S. Cl.
CPC ............ *H05K 1/0271* (2013.01); *H05K 1/0207* (2013.01); *H05K 1/113* (2013.01); *H05K 13/0465* (2013.01); *H05K 2201/09772* (2013.01)

(58) Field of Classification Search
CPC ............ H05K 13/0465; H05K 1/0207; H05K 1/0271; H05K 1/113
USPC .......................... 174/266; 361/767; 228/179.1
See application file for complete search history.

(56) References Cited

U.S. PATENT DOCUMENTS 5,489,752 A * 2/1996 Cognetti ............. H01L 23/3677
174/260
6,288,906 B1 * 9/2001 Sprietsma ............ H05K 1/0207
174/260

(Continued)

FOREIGN PATENT DOCUMENTS

CN 100417310 C 9/2008
CN 101316482 A 12/2008

(Continued)

OTHER PUBLICATIONS

European Office Action dated May 12, 2014 from EP Counterpart Appln No. 13179343.2.

(Continued)

*Primary Examiner* — Timothy Thompson
*Assistant Examiner* — Rhadames J Alonzo Miller
(74) *Attorney, Agent, or Firm* — Fitzpatrick, Cella, Harper & Scinto

(57) ABSTRACT

Provided is a printed wiring board including a first heat dissipation pattern placed in one surface layer on which a semiconductor package is to be mounted, a second heat dissipation pattern placed in the other surface layer, and an inner layer conductor pattern placed in an inner layer, in which through holes are formed in the printed wiring board; the first heat dissipation pattern has a joint portion which is placed in an opposed region opposed to a heat sink of the semiconductor package and which is joined to the heat sink with solder; at least one of the through holes is placed in the opposed region; and the second heat dissipation pattern is formed in a pattern in which an end portion of a conductor film in the one of the through holes on the other surface layer side is separated.

14 Claims, 7 Drawing Sheets

(51) Int. Cl.
*H05K 1/02* (2006.01)
*H05K 13/04* (2006.01)

(56) References Cited

U.S. PATENT DOCUMENTS

| | | | |
|---|---|---|---|
| 6,803,257 B2 | 10/2004 | Lee et al. | |
| 2002/0172025 A1* | 11/2002 | Megahed | H01L 23/3677 361/767 |
| 2005/0005437 A1* | 1/2005 | Nakamura | B32B 7/12 29/846 |
| 2008/0303145 A1 | 12/2008 | Takizawa et al. | |
| 2012/0018194 A1* | 1/2012 | Maeda | H05K 3/0035 174/251 |
| 2012/0105096 A1* | 5/2012 | Kuah | G01R 31/2812 324/763.01 |

FOREIGN PATENT DOCUMENTS

| | | |
|---|---|---|
| JP | 08-162766 A | 6/1996 |
| JP | 2006-080168 | 3/2006 |
| JP | 2009-141236 A | 6/2009 |
| JP | 2011-108814 A | 6/2011 |

OTHER PUBLICATIONS

Chinese Office Action dated Dec. 3, 2015 for counterpart Chinese Patent Appln 201310337875.6.

* cited by examiner

PRINTED WIRING BOARD, PRINTED CIRCUIT BOARD, AND PRINTED CIRCUIT BOARD MANUFACTURING METHOD

BACKGROUND OF THE INVENTION

1. Field of the Invention

The present invention relates to a printed wiring board having a semiconductor package including a heat sink mounted thereon, a printed circuit board including the printed wiring board, and a printed circuit board manufacturing method.

2. Description of the Related Art

In a semiconductor package such as an IC which is mounted on a printed wiring board, a heat sink for dissipating generated heat is provided on a rear surface of a semiconductor package body. This is because, in recent years, as signal processing in a semiconductor package becomes faster, heat generated in the semiconductor package tends to increase, and it is necessary to efficiently dissipate heat in the semiconductor package. Japanese Patent Application Laid-Open No. 2006-80168 discloses a printed wiring board in which, for the purpose of efficiently dissipating heat generated in such a semiconductor package, a heat sink of the semiconductor package and a conductor pattern on a mounting surface of the printed wiring board are soldered.

The conductor pattern on the mounting surface is required to be opposed to the heat sink of the semiconductor package and to be sized so as not to interfere with a pin of the semiconductor package. Further, an insulator used for the printed wiring board has a thermal conductivity which is lower than that of the conductor pattern, and thus, the conductor pattern is liable to store heat. Therefore, in Japanese Patent Application Laid-Open No. 2006-80168, another conductor pattern for dissipating heat is provided on a surface opposite to the mounting surface of the printed wiring board, and through holes thermally connect the conductor pattern on the mounting surface and the conductor pattern on the opposite surface. This enables heat generated in a die of the semiconductor package to be conducted through the heat sink, the solder, the conductor pattern on the mounting surface, the through holes, and the conductor pattern on the opposite surface in this order to be dissipated from the conductor pattern on the opposite surface into the atmosphere.

By the way, in a reflow step of soldering the heat sink and the conductor pattern on the mounting surface, if molten solder is drawn in the through holes, poor soldering is caused, which results in lowered mountability of the semiconductor package and lowered heat dissipation.

Therefore, in Japanese Patent Application Laid-Open No. 2006-80168, the conductor pattern on the mounting surface is divided by a solder resist, and the through holes are arranged in a center area thereof which is not to be soldered. The solder resist is caused to function as a barrier to the molten solder in the reflow step in an attempt to prevent the solder from flowing in the through holes.

However, even if the conductor pattern for dissipating heat is divided and the through holes are provided in the center area thereof which is not to be soldered as in the structure disclosed in Japanese Patent Application Laid-Open No. 2006-80168, the through holes are located so as to be opposed to the heat sink of the semiconductor package. Further, even after the reflow step is completed, residual heat remaining in the conductor pattern on the opposite surface tends to be conducted via the through holes to the conductor pattern on the mounting surface. As a result, the solder is melted by the residual heat conducted to the conductor pattern on the mounting surface, and when being pressed against the heat sink to flow, the solder crosses the solder resist and flows in the through holes. Therefore, the structure disclosed in Japanese Patent Application Laid-Open No. 2006-80168 cannot effectively eliminate poor soldering, and further improvement is required.

SUMMARY OF THE INVENTION

Accordingly, it is an object of the present invention to provide a printed wiring board, a printed circuit board, and a printed circuit board manufacturing method which reduce the occurrence of poor soldering.

A printed circuit board according to one embodiment of the present invention, includes: a semiconductor package; a printed wiring board having the semiconductor package mounted on a first surface layer thereof, the printed wiring board including: a first conductor pattern formed in a region of the first surface layer on which the semiconductor package is to be mounted; a second conductor pattern placed in a second surface layer on a side opposite to the first surface layer; a first through hole piercing the first surface layer, an inner layer, and the second surface layer; a second through hole piercing the first surface layer, the inner layer, and the second surface layer; and a solder member placed between the semiconductor package and the printed wiring board, for joining a conductive member provided in the semiconductor package and the first conductor pattern together, in which: the first conductor pattern includes: a first plane-like conductive pattern; and a first pad-like conductive pattern which is surrounded by the first plane-like conductive pattern and is placed with a gap between the first pad-like conductive pattern and the first plane-like conductive pattern; the second conductor pattern includes: a second plane-like conductive pattern; and a second pad-like conductive pattern which is surrounded by the second plane-like conductive pattern and is placed with a gap between the second pad-like conductive pattern and the second plane-like conductive pattern; the first plane-like conductive pattern and the second pad-like conductive pattern are connected to each other via the first through hole; and the second plane-like conductive pattern and the first pad-like conductive pattern are connected to each other via the second through hole.

Further features of the present invention will become apparent from the following description of exemplary embodiments with reference to the attached drawings.

DESCRIPTION OF THE EMBODIMENTS

Embodiments of the present invention are described in detail below with reference to the attached drawings.

(First Embodiment)

Figure 1A:
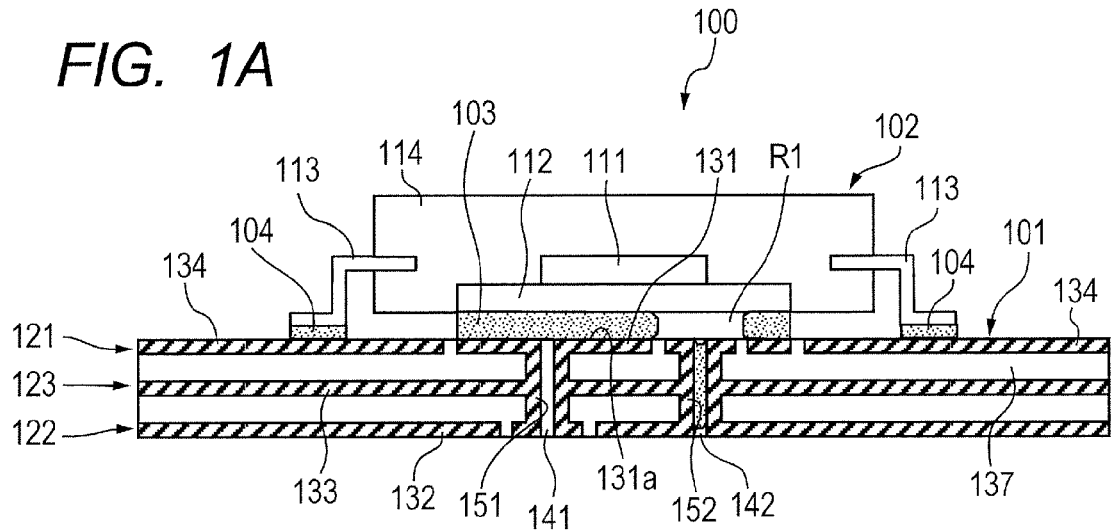
FIGS. 1A, 1B, 1C, and 1D are explanatory diagrams illustrating a schematic structure of a printed circuit board according to a first embodiment of the present invention.
Figure 1B:
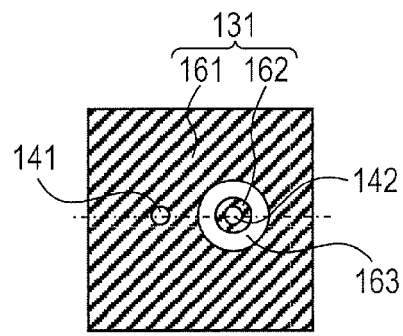
Figure 1C:
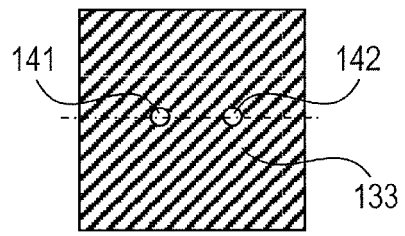
Figure 1D:
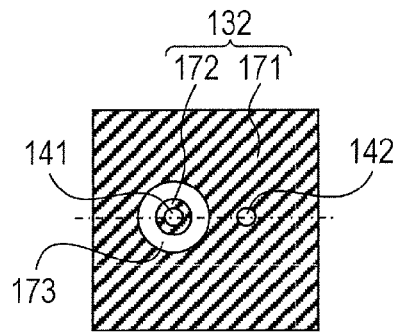

FIGS. 1A to 1D are explanatory diagrams illustrating a schematic structure of a printed circuit board according to a first embodiment of the present invention. FIG. 1A is a sectional view of the printed circuit board, FIG. 1B is a plan view of a first conductor pattern of a printed wiring board, FIG. 1C is a plan view of an inner layer conductor pattern of the printed wiring board, and FIG. 1D is a plan view of a second conductor pattern of the printed wiring board.

As illustrated in FIG. 1A, a printed circuit board 100 includes a printed wiring board 101 and a semiconductor package 102 mounted on the printed wiring board 101. In the first embodiment, the semiconductor package 102 is a QFP, QFN, or BGA semiconductor package. In FIGS. 1A to 1D, the semiconductor package 102 is illustrated as a QFP semiconductor package.

The semiconductor package 102 includes a die 111 which is a semiconductor element and a heat source, a heat sink 112 which is thermally connected to the die 111, and leads 113 which are electrically connected to the die 111 through wires (not shown). The die 111, a part of the heat sink 112, and a part of the leads 113 are encapsulated with a mold resin 114.

The printed wiring board 101 is a three-layer printed wiring board in which a surface layer 121 which is a first surface layer on which the semiconductor package 102 is mounted, a surface layer 122 which is a second surface layer on a side opposite to the surface layer 121, and an inner layer 123 between the surface layer 121 and the surface layer 122 are stacked with insulating layers therebetween. As the insulating layers, an insulator 137 is provided.

The printed wiring board 101 includes a heat dissipation pattern 131 which is a first conductor pattern arranged in the surface layer 121, a heat dissipation pattern 132 which is a second conductor pattern arranged in the surface layer 122, and an inner layer conductor pattern 133 arranged in the inner layer 123. The printed wiring board 101 also includes a signal line pattern 134 which is arranged in the surface layer 121 and which is electrically connected to the leads 113 of the semiconductor package 102. In the first embodiment, the heat dissipation pattern 131 and the signal line pattern 134 are electrically insulated from each other by the insulator 137. These patterns 131, 132, 133, and 134 are formed of, for example, copper.

The heat dissipation pattern 131 has a joint portion 131a which is placed in an opposed region R1 opposed to the heat sink 112 of the semiconductor package 102 and which is joined to the heat sink 112 with solder 103. In the first embodiment, the entire surface of the heat dissipation pattern 131 is the joint portion 131a. The joint portion 131a and the heat sink 112 are joined together with the solder 103. The outer periphery of the heat dissipation pattern 131 is surrounded by the leads 113 of the semiconductor package 102, and the heat dissipation pattern 131 is formed in a shape which is not brought into contact with the leads 113 (for example, a rectangular outer shape). Note that, the leads 113 of the semiconductor package 102 and the signal line pattern 134 are joined together with solder 104. The heat dissipation pattern 132 is a pattern having an area larger than that of the heat dissipation pattern 131.

A through hole 141 as a first through hole and a through hole 142 as a second through hole are formed in the printed wiring board 101 to pierce the surface layer 121, the inner layer 123, and the surface layer 122. In the first embodiment, a case in which one first through hole and one second through hole are formed is described. In the first embodiment, the through holes 141 and 142 are placed in the opposed region R1.

A conductor film 151 as a first conductor film is provided on an inner wall of the through hole 141, while a conductor film 152 as a second conductor film is provided on an inner wall of the through hole 142. These conductor films 151 and 152 are formed of, for example, copper.

The conductor film 151 is formed so as to extend from an end portion of the through hole 141 on the surface layer 121 side corresponding to the first surface layer side to an end portion of the through hole 141 on the surface layer 122 side corresponding to the second surface layer side. Similarly, the conductor film 152 is formed so as to extend from an end portion of the through hole 142 on the surface layer 121 side to an end portion of the through hole 142 on the surface layer 122 side.

In the first embodiment, as illustrated in FIG. 1B, the heat dissipation pattern 131 has, in the surface layer 121, a plane-like conductive pattern 161 (first plane-like conductive pattern) which is physically connected to the conductor film 151 in the through hole 141. Further, the heat dissipation pattern 131 has, in the surface layer 121, a pad-like conductive pattern 162 (first pad-like conductive pattern) which is physically connected to the conductor film 152 in the through hole 142. A clearance 163 is provided between the plane-like conductive pattern 161 and the pad-like conductive pattern 162, and the plane-like conductive pattern 161 and the pad-like conductive pattern 162 are not held in contact with each other in the surface layer 121. The pad-like conductive pattern 162 has an area smaller than that of the plane-like conductive pattern 161.

Further, in the first embodiment, as illustrated in FIG. 1D, the heat dissipation pattern 132 has, in the surface layer 122, a plane-like conductive pattern 171 (second plane-like conductive pattern) which is physically connected to the conductor film 152 in the through hole 142. The plane-like conductive pattern 171 is formed so as to extend beyond an outer peripheral region of the semiconductor package 102 when the printed circuit board 100 is seen from the semiconductor package 102 side. Further, the heat dissipation pattern 132 has, in the surface layer 122, a pad-like conductive pattern 172 (second pad-like conductive pattern 172) which is physically connected to the conductor film 151 in the through hole 141. A clearance 173 is provided between the plane-like conductive pattern 171 and the pad-like conductive pattern 172, and the plane-like conductive pattern 171 and the pad-like conductive pattern 172 are not held in contact with each other in the surface layer 122. The pad-like conductive pattern 172 has an area smaller than that of the plane-like conductive pattern 171.

In other words, as illustrated in FIG. 1B, the end portion of the conductor film 151 on the surface layer 121 side is physically connected in the surface layer 121 to the plane-like conductive pattern 161, and thus the conductor film 151 is electrically and thermally connected to the plane-like conductive pattern 161. As illustrated in FIG. 1C, a middle portion of the conductor film 151 is physically connected in the inner layer 123 to the inner layer conductor pattern 133, and thus the conductor film 151 is electrically and thermally connected to the inner layer conductor pattern 133. Further, as illustrated in FIG. 1D, the end portion of the conductor film 151 on the surface layer 122 side is physically connected in the surface layer 122 to the pad-like conductive pattern 172, and thus the conductor film 151 is electrically and thermally connected to the pad-like conductive pattern 172.

In addition, as illustrated in FIG. 1D, the end portion of the conductor film 152 on the surface layer 122 side is physically connected in the surface layer 122 to the plane-like conductive pattern 171, and thus the conductor film 152 is electrically and thermally connected to the plane-like conductive pattern 171. As illustrated in FIG. 1C, a middle portion of the conductor film 152 is physically connected in the inner layer 123 to the inner layer conductor pattern 133, and thus the conductor film 152 is electrically and thermally connected to the inner layer conductor pattern 133. Further, as illustrated in FIG. 1D, the end portion of the conductor film 152 on the surface layer 121 side is physically connected in the surface layer 121 to the pad-like conductive pattern 162, and thus the conductor film 152 is electrically and thermally connected to the pad-like conductive pattern 162.

The heat dissipation pattern 131 is formed in a pattern in which the plane-like conductive pattern 161 and the pad-like conductive pattern 162 are separated by the clearance 163, that is, a pattern in which the end portion of the conductor film 152 on the surface layer 121 side is separated. Further, the heat dissipation pattern 132 is formed in a pattern in which the plane-like conductive pattern 171 and the pad-like conductive pattern 172 are separated by the clearance 173, that is, a pattern in which the end portion of the conductor film 151 on the surface layer 122 side is separated.

In this way, the end portion of the conductor film 151 in the through hole 141 on the surface layer 122 side is separated from the plane-like conductive pattern 171 by a gap, and hence, in the surface layer 122, heat in the plane-like conductive pattern 171 is less liable to be conducted to the end portion of the conductor film 151 on the surface layer 122 side. Further, the end portion of the conductor film 152 in the through hole 142 on the surface layer 121 side is separated from the plane-like conductive pattern 161 by a gap, and hence, in the surface layer 121, heat in the conductor film 152 is less liable to be conducted to the plane-like conductive pattern 161.

As the clearances 163 and 173 become larger, the areas of the conductors of the printed wiring board 101 under the heat sink 112 become smaller, and the distance between the through hole 141 and the through hole 142 becomes larger. Therefore, as the clearances 163 and 173 become larger, the heat dissipation of the semiconductor package 102 during its operation is lowered. Therefore, it is desired that the clearances 163 and 173 have the width similar to the width of the signal line pattern 134.

From the viewpoint of the heat dissipation of the semiconductor package 102 during its operation, it is preferred that the conductor film 151 in the through hole 141 and the conductor film 152 in the through hole 142 be connected to each other via a solid pattern, and it is desired that the area of the solid pattern be as large as possible. Specifically, it is enough that the inner layer conductor pattern 133 is a conductor pattern placed in the inner layer 123, but it is preferred that the inner layer conductor pattern 133 be a solid conductor pattern. Exemplary solid conductor patterns include a power supply pattern to which a direct current power supply voltage is applied and a ground pattern to which a ground voltage (0 V) is applied. It is preferred that the inner layer conductor pattern 133 be any one of a power supply pattern and a ground pattern. In the first embodiment, the inner layer conductor pattern 133 is a ground pattern. In this way, the inner layer conductor pattern 133 is a ground pattern, and thus, it is not necessary to, for connection between the conductor film 151 and the conductor film 152, additionally provide a conductor pattern other than the ground pattern. Note that, when the inner layer conductor pattern 133 is a power supply pattern, similarly, it is not necessary to additionally provide a conductor pattern.

In the first embodiment, a ground terminal of the die 111 is electrically connected to the heat sink 112, and the heat sink 112 also serves as a ground terminal of the semiconductor package 102. Therefore, the heat sink 112 which is a ground terminal of the semiconductor package 102 is electrically connected to the inner layer conductor pattern 133 which is a ground pattern via the conductor film 151 in the through hole 141.

Note that, when the inner layer conductor pattern 133 is a power supply pattern, a power supply terminal of the die 111 may be electrically connected to the heat sink 112 to cause the heat sink 112 to function as a power supply terminal of the semiconductor package 102. Also in this case, the heat sink 112 and the joint portion 131a may be joined together with the solder 103.

Figure 2A:
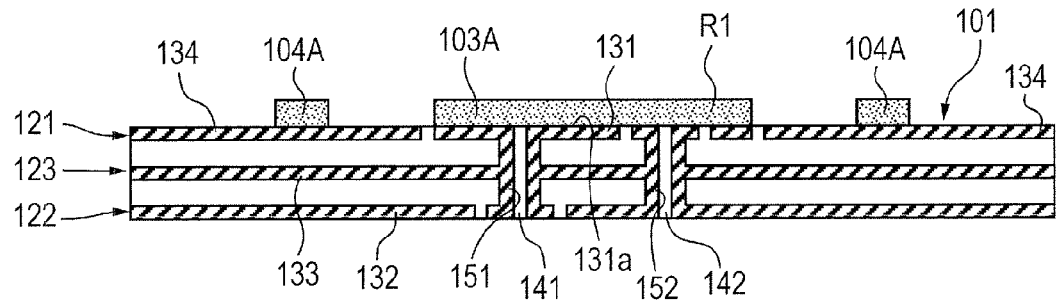
FIGS. 2A, 2B, and 2C are explanatory diagrams illustrating steps in a method of manufacturing the printed circuit board.
Figure 2B:
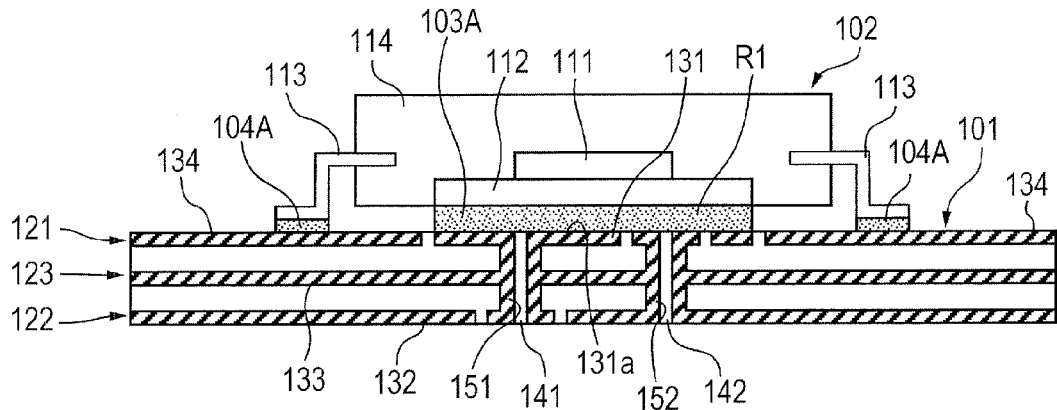
Figure 2C:
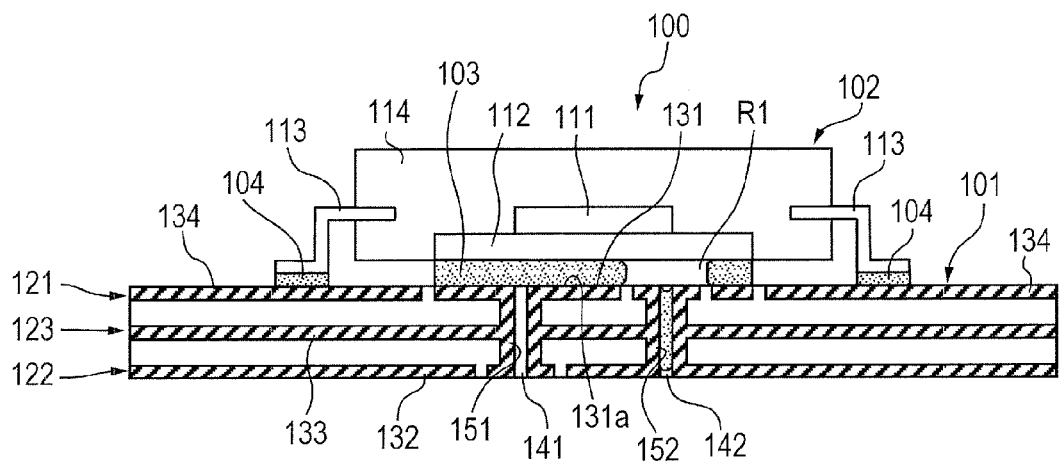

Next, a method of manufacturing the printed circuit board 100 is described. FIGS. 2A to 2C are explanatory diagrams illustrating steps in the method of manufacturing the printed circuit board. FIG. 2A illustrates an application step, FIG. 2B illustrates a mounting step, and FIG. 2C illustrates a reflow step.

As illustrated in FIG. 2A, a solder paste 103A is applied to the joint portion 131a of the heat dissipation pattern 131 in the printed wiring board 101 (application step). In this application step, a solder paste 104A is applied to portions corresponding to the leads 113 of the semiconductor package 102. In this application step, the solder pastes 103A and 104A are applied to the surface layer 121 by screen printing using a mask (not shown).

Next, as illustrated in FIG. 2B, the semiconductor package 102 is mounted on the surface layer 121 (mounting step). At this time, the heat sink 112 of the semiconductor package 102 is brought into contact with the solder paste 103A, and at the same time, the leads 113 of the semiconductor package 102 are brought into contact with the solder paste 104A.

Next, as illustrated in FIG. 2C, the solder pastes 103A and 104A are heated under a state in which the heat sink 112 is held in contact with the solder paste 103A and the leads 113 are held in contact with the solder paste 104A (reflow step). This melts the solder pastes 103A and 104A. After the heating is completed, the joining together of the heat sink 112 and the joint portion 131a with the solder 103 is completed to obtain the printed circuit board 100. In the heating in the reflow step, the temperature of an outer peripheral surface of the printed circuit board 100 becomes higher than that of the inside thereof.

In the first embodiment, after the reflow step, direct conduction of residual heat remaining in the plane-like conductive pattern 171 of the heat dissipation pattern 132 to the conductor film 151 in the through hole 141 is reduced by the clearance 173. Further, the conductor film 151 in the through hole 141 and the conductor film 152 in the through hole 142 are connected to each other through the inner layer conductor pattern 133, and the thermal resistances of the conductor patterns 132 and 133 are higher than the thermal resistances of the conductor films 151 and 152 in the through holes and the thermal resistance to the outside air. Therefore, most of the residual heat remaining in the plane-like conductive pattern 171 of the heat dissipation pattern 132 is dissipated into the outside air, and the rest of the residual heat is conducted to the conductor film 152 in the through hole 142. Almost none of the heat conducted to the conductor film 152 is conducted to the inner layer conductor pattern 133, and thus, conduction of the residual heat remaining in the plane-like conductive pattern 171 to the conductor film 151 in the through hole 141 is inhibited.

This inhibits temperature rise in the through hole 141, and thus, melting of the solder in the vicinity of the through hole 141 can be inhibited. Therefore, inflow of molten solder to the through hole 141 can be inhibited.

Further, residual heat remaining in the plane-like conductive pattern 171 of the heat dissipation pattern 132 is conducted via the conductor film 152 in the through hole 142 to the pad-like conductive pattern 162 in the surface layer 121. However, the clearance 163 is provided, and thus, conduction of the residual heat to the plane-like conductive pattern 161 is inhibited. Therefore, the solder 103 is molten only in the vicinity of the pad-like conductive pattern 162, and the amount of the solder which is drawn in the through hole 142 is reduced compared with a conventional case.

Therefore, occurrence of poor soldering because of a gap caused between the heat sink 112 and the heat dissipation pattern 131 can be reduced.

Figure 6A:
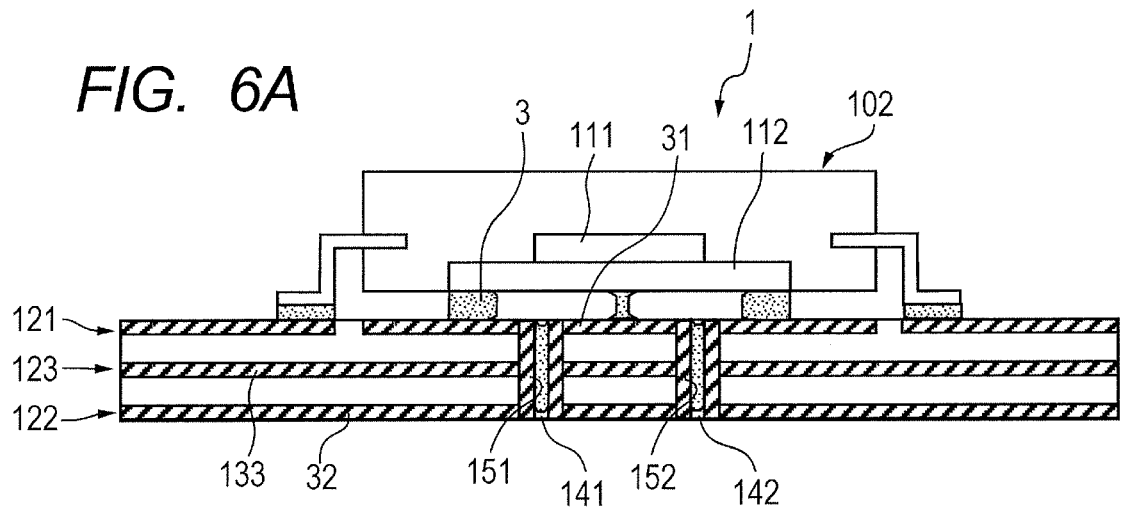
FIGS. 6A, 6B, 6C, and 6D are explanatory diagrams illustrating a schematic structure of a printed circuit board according to a comparative example of the present invention.
Figure 6B:
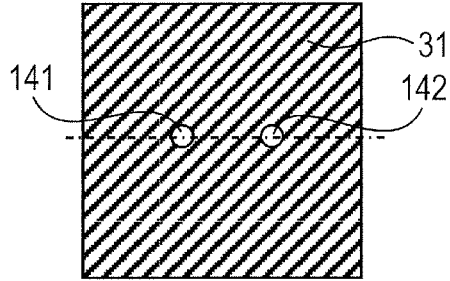
Figure 6C:
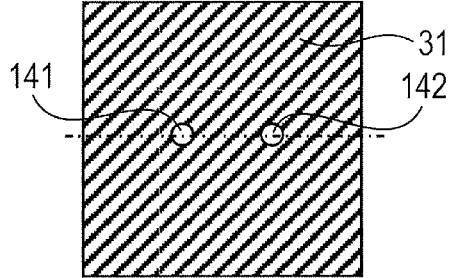
Figure 6D:
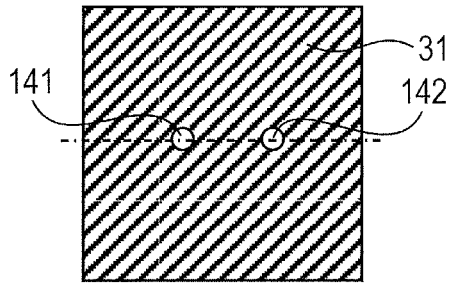

Next, a printed circuit board according to a comparative example of the present invention without the clearances 163 and 173 is described. FIGS. 6A to 6D are explanatory diagrams illustrating a schematic structure of the printed circuit board according to the comparative example. FIG. 6A is a sectional view of the printed circuit board, FIG. 6B is a plan view of a first conductor pattern of the printed wiring board, FIG. 6C is a plan view of an inner layer conductor pattern of the printed wiring board, and FIG. 6D is a plan view of a second conductor pattern of the printed wiring board. A printed circuit board 1 is different from the printed circuit board 100 illustrated in FIGS. 1A to 1D in that the clearances 163 and 173 are not provided therein. Specifically, a heat dissipation pattern 31 in the surface layer 121 is directly connected to the conductor films 151 and 152 in the respective through holes 141 and 142, and a heat dissipation pattern 32 in the surface layer 122 is directly connected to the conductor films 151 and 152 in the respective through holes 141 and 142.

Figure 7A:
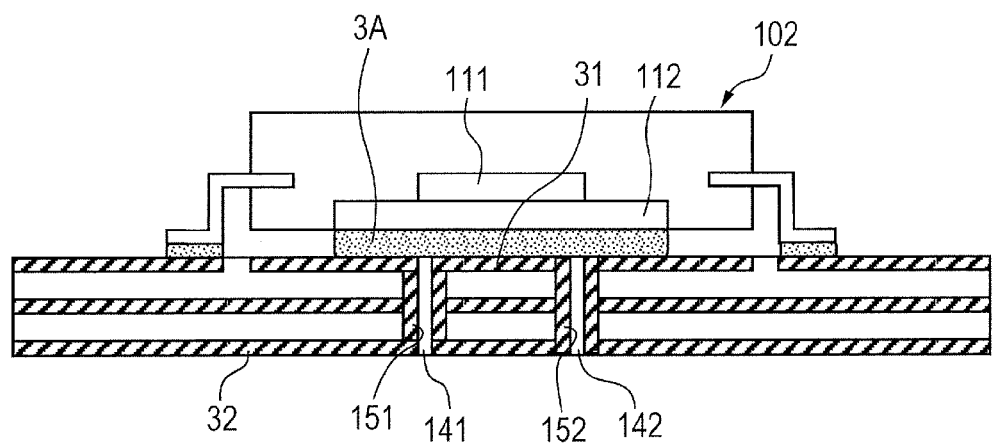
FIGS. 7A and 7B are explanatory diagrams illustrating steps in a method of manufacturing the printed circuit board according to the comparative example.
Figure 7B:
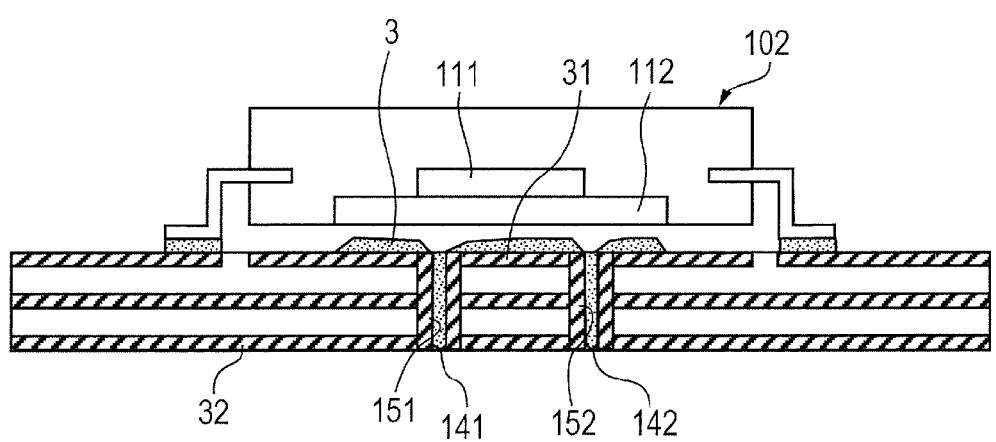

FIGS. 7A and 7B are explanatory diagrams illustrating steps in a method of manufacturing the printed circuit board according to the comparative example. FIG. 7A illustrates a mounting step and FIG. 7B illustrates a reflow step.

Before the reflow step, as illustrated in FIG. 7A, a solder paste 3A fills the space between the heat sink 112 and the heat dissipation pattern 31. After the reflow step is completed, as illustrated in FIG. 7B, the insides of the through holes 141 and 142 are heated by residual heat remaining in the heat dissipation pattern 32 to melt solder 3. The molten solder 3 flows in the through holes 141 and 142, and a soldered area between the heat sink 112 and the heat dissipation pattern 31 is reduced to cause poor soldering. In this way, in the printed circuit board 1 according to the comparative example, poor soldering of the solder 3 occurs, and thus, heat generated in the die 111 is conducted to the heat sink 112, but the heat conducted to the heat sink 112 cannot be efficiently conducted to the heat dissipation pattern 31. As a result, the semiconductor package 102 stores heat.

As described above, according to the first embodiment, after the reflow step in the manufacturing steps is completed, heat conduction from the plane-like conductive pattern 171 of the heat dissipation pattern 132 to the conductor film 151 in the through hole 141 can be prevented to inhibit temperature rise inside the through hole 141. Therefore, the solder can be prevented from being drawn in the through hole 141.

Further, the residual heat remaining in the plane-like conductive pattern 171 is conducted via the conductor film 152 in the through hole 142 to the pad-like conductive pattern 162. However, due to the presence of the clearance 163, the heat is less liable to be conducted to the plane-like conductive pattern 161, and thus, the amount of the solder which is drawn in the through hole 142 can be reduced.

Therefore, occurrence of poor soldering between the heat sink 112 and the joint portion 131a can be reduced.

Further, steady heat generated when the semiconductor package 102 is operated is conducted to the solder 103, the plane-like conductive pattern 161 of the heat dissipation pattern 131, the conductor film 151, the inner layer conductor pattern 133, the conductor film 152, and the plane-like conductive pattern 171 of the heat dissipation pattern 132 in this order. Heat conducted to the plane-like conductive pattern 171 is dissipated from the plane-like conductive pattern 171 into the outside air. Therefore, heat dissipation of the semiconductor package 102 during its operation is not impaired.

Further, the through holes 141 and 142 are placed in the opposed region R1, and thus, the through holes 141 and 142 are close to each other, and the thermal resistance in the inner layer conductor pattern 133 is lowered and heat can be efficiently dissipated from the semiconductor package 102.

(Second Embodiment)

Next, a printed circuit board according to a second embodiment of the present invention is described.

Figure 3A:
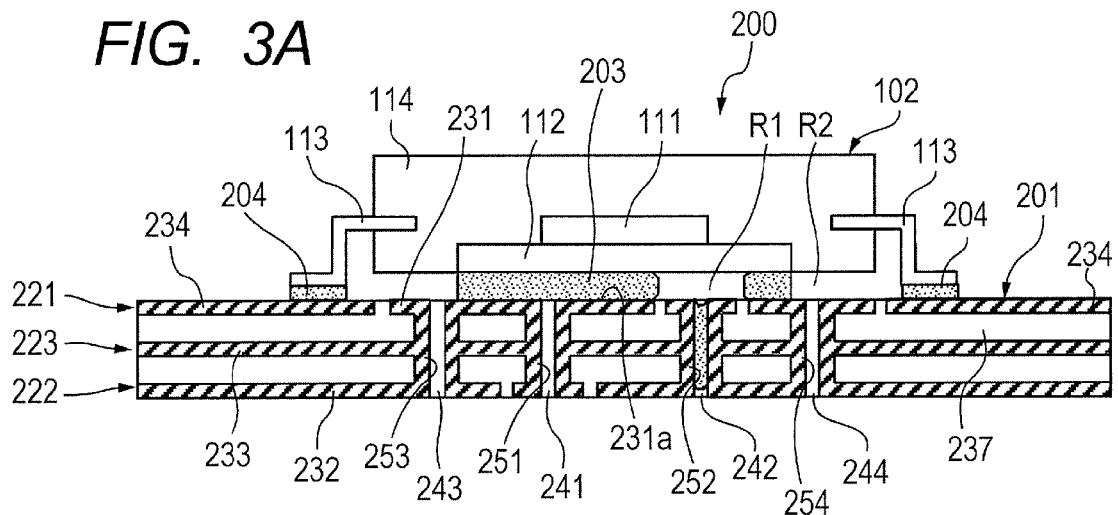
FIGS. 3A, 3B, 3C, and 3D are explanatory diagrams illustrating a schematic structure of a printed circuit board according to a second embodiment of the present invention.
Figure 3B:
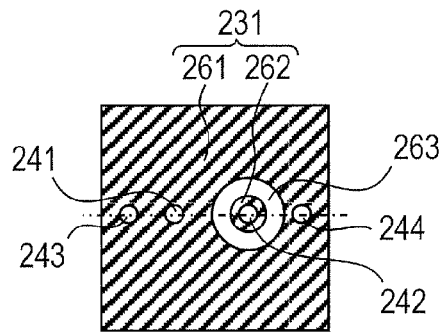
Figure 3C:
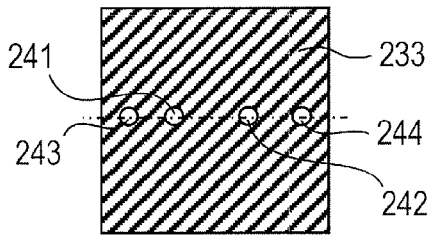
Figure 3D:
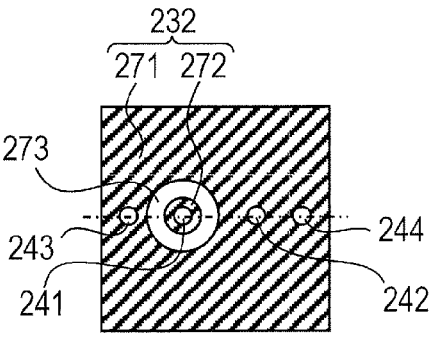

FIGS. 3A to 3D are explanatory diagrams illustrating a schematic structure of the printed circuit board according to the second embodiment of the present invention. FIG. 3A is a sectional view of the printed circuit board, FIG. 3B is a plan view of a first conductor pattern of the printed wiring board, FIG. 3C is a plan view of an inner layer conductor pattern of the printed wiring board, and FIG. 3D is a plan view of a second conductor pattern of the printed wiring board.

As illustrated in FIG. 3A, a printed circuit board 200 includes a printed wiring board 201 and a semiconductor package 102 which is similar to that according to the first embodiment and mounted on the printed wiring board 201.

The printed wiring board 201 is a three-layer printed wiring board in which a surface layer 221 which is a first surface layer on which the semiconductor package 102 is mounted, a surface layer 222 which is a second surface layer on a side opposite to the surface layer 221, and an inner layer 223 between the surface layer 221 and the surface layer 222 are stacked with insulating layers therebetween. As the insulating layers, an insulator 237 is provided.

The printed wiring board 201 includes a heat dissipation pattern 231 which is a first conductor pattern arranged in the surface layer 221, a heat dissipation pattern 232 which is a second conductor pattern arranged in the surface layer 222, and an inner layer conductor pattern 233 arranged in the inner layer 223. The printed wiring board 201 also includes a signal line pattern 234 which is arranged in the surface layer 221 and which is electrically connected to the leads 113 of the semiconductor package 102. In the second embodiment, the heat dissipation pattern 231 and the signal line pattern 234 are electrically insulated from each other by the insulator 237. These patterns 231, 232, 233, and 234 are formed of, for example, copper.

The heat dissipation pattern 231 has a joint portion 231a which is placed in an opposed region R1 opposed to the heat sink 112 of the semiconductor package 102 and which is joined to the heat sink 112 with solder 203. In the second embodiment, the middle portion of the surface of the heat dissipation pattern 231 is the joint portion 231a. The joint portion 231a and the heat sink 112 are joined together with the solder 203. The outer periphery of the heat dissipation pattern 231 is surrounded by the leads 113 of the semiconductor package 102, and the heat dissipation pattern 231 is formed in a shape which is not brought into contact with the leads 113 (for example, a rectangular outer shape). Note that, the leads 113 of the semiconductor package 102 and the signal line pattern 234 are joined together with solder 204. The heat dissipation pattern 232 is a pattern having an area larger than that of the heat dissipation pattern 231.

A through hole 241 as a first through hole, a through hole 242 as a second through hole, and through holes 243 and 244 as third through holes are formed in the printed wiring board 201 to pierce the surface layer 221, the inner layer 223, and the surface layer 222. In the second embodiment, a case in which one first through hole and one second through hole are formed and multiple third through holes are formed is described.

A conductor film 251 as a first conductor film is provided on an inner wall of the through hole 241, while conductor films 252, 253, and 254 as second conductor films are provided on inner walls of the through holes 242, 243, and 244, respectively. These conductor films 251 to 254 are formed of, for example, copper.

The conductor film 251 is formed so as to extend from an end portion of the through hole 241 on the surface layer 221 side corresponding to the first surface layer side to an end portion of the through hole 241 on the surface layer 222 side corresponding to the second surface layer side. Similarly, the conductor film 252 is formed so as to extend from an end portion of the through hole 242 on the surface layer 221 side to an end portion of the through hole 242 on the surface layer 222 side. Further, the conductor film 253 is formed so as to extend from an end portion of the through hole 243 on the surface layer 221 side to an end portion of the through hole 243 on the surface layer 222 side. Further, the conductor film 254 is formed so as to extend from an end portion of the through hole 244 on the surface layer 221 side to an end portion of the through hole 244 on the surface layer 222 side.

As illustrated in FIG. 3B, the heat dissipation pattern 231 has, in the surface layer 221, a solid conductor pattern 261 which is physically connected to the conductor films 251, 253, and 254 in the respective through holes 241, 243, and 244. Further, the heat dissipation pattern 231 has, in the surface layer 221, a conductor land 262 which is physically connected to the conductor film 252 in the through hole 242. A clearance 263 is provided between the conductor pattern 261 and the conductor land 262, and the conductor pattern 261 and the conductor land 262 are not held in contact with each other in the surface layer 221. The conductor land 262 has an area smaller than that of the conductor pattern 261.

Further, as illustrated in FIG. 3D, the heat dissipation pattern 232 has, in the surface layer 222, a solid conductor pattern 271 which is physically connected to the conductor films 252, 253, and 254 in the respective through holes 242, 243, and 244. Further, the heat dissipation pattern 232 has, in the surface layer 222, a conductor land 272 which is physically connected to the conductor film 251 in the through hole 241. A clearance 273 is provided between the conductor pattern 271 and the conductor land 272, and the conductor pattern 271 and the conductor land 272 are not held in contact with each other in the surface layer 222. The conductor land 272 has an area smaller than that of the conductor pattern 271.

In other words, as illustrated in FIG. 3B, the end portion of the conductor film 251 on the surface layer 221 side is physically connected in the surface layer 221 to the conductor pattern 261, and thus the conductor film 251 is electrically and thermally connected to the conductor pattern 261. As illustrated in FIG. 3C, a middle portion of the conductor film 251 is physically connected in the inner layer 223 to the inner layer conductor pattern 233, and thus the conductor film 251 is electrically and thermally connected to the inner layer conductor pattern 233. Further, as illustrated in FIG. 3D, the end portion of the conductor film 251 on the surface layer 222 side is physically connected in the surface layer 222 to the conductor land 272, and thus the conductor film 251 is electrically and thermally connected to the conductor land 272.

Further, as illustrated in FIG. 3D, the end portion of the conductor film 252 on the surface layer 222 side is physically connected in the surface layer 222 to the conductor pattern 271, and thus the conductor film 252 is electrically and thermally connected to the conductor pattern 271. As illustrated in FIG. 3C, a middle portion of the conductor film 252 is physically connected in the inner layer 223 to the inner layer conductor pattern 233, and thus the conductor film 252 is electrically and thermally connected to the inner layer conductor pattern 233. Further, as illustrated in FIG. 3B, the end portion of the conductor film 252 on the surface layer 221 side is physically connected in the surface layer 221 to the conductor land 262, and thus the conductor film 252 is electrically and thermally connected to the conductor land 262.

In this way, the heat dissipation pattern 231 is formed in a pattern in which the conductor pattern 261 and the conductor land 262 are separated by the clearance 263, that is, a pattern in which the end portion of the conductor film 252 on the surface layer 221 side is separated. Further, the heat dissipation pattern 232 is formed in a pattern in which the conductor pattern 271 and the conductor land 272 are separated by the clearance 273, that is, a pattern in which the end portion of the conductor film 251 on the surface layer 222 side is separated.

In this way, the end portion of the conductor film 251 in the through hole 241 on the surface layer 222 side is separated from the conductor pattern 271 by a gap, and, in the surface layer 222, heat in the conductor pattern 271 is less liable to be conducted to the end portion of the conductor film 251 on the surface layer 222 side. Further, the end portion of the conductor film 252 in the through hole 242 on the surface layer 221 side is separated from the conductor pattern 261 by a gap, and, in the surface layer 221, heat in the conductor film 252 is less liable to be conducted to the conductor pattern 261.

In the second embodiment, among the through holes 241, 242, 243, and 244, the through holes 241 and 242 are placed in the opposed region R1, and the through holes 243 and 244 are placed in a region R2 other than the opposed region. Therefore, in the application step in the manufacturing steps of the printed circuit board 200, a solder paste is applied onto the through holes 241 and 242, but a solder paste is not applied onto the through holes 243 and 244.

In the second embodiment, the possibility that the solder paste is drawn in the through holes 243 and 244 is low, and thus, both ends of the conductor films 253 and 254 in the respective through holes 243 and 244 are connected to the conductor patterns 261 and 271, respectively.

From the viewpoint of the heat dissipation of the semiconductor package 102 during its operation, it is preferred that the conductor films 251 to 254 in the respective through holes 241 to 244 be connected to one another via a solid pattern, and it is desired that the area of the solid pattern be as large as possible. Specifically, it is enough that the inner layer conductor pattern 233 is a conductor pattern placed in the inner layer 223, but it is preferred that the inner layer conductor pattern 233 be a solid conductor pattern. Exemplary solid conductor patterns include a power supply pattern to which a direct current power supply voltage is applied and a ground pattern to which a ground voltage (0 V) is applied. It is preferred that the inner layer conductor pattern 233 be any one of a power supply pattern and a ground pattern. In the second embodiment, the inner layer conductor pattern 233 is a ground pattern. In this way, the inner layer conductor pattern 233 is a ground pattern, and thus, it is not necessary to, for connection among the conductor films 251 to 254, additionally provide a conductor pattern other than the ground pattern. Note that, when the inner layer conductor pattern 233 is a power supply pattern, similarly, it is not necessary to additionally provide a conductor pattern.

In the second embodiment, a ground terminal of the die 111 is electrically connected to the heat sink 112, and the heat sink 112 also serves as a ground terminal of the semiconductor package 102. Therefore, the heat sink 112 which is a ground terminal of the semiconductor package 102 is electrically connected to the inner layer conductor pattern 233 which is a ground pattern via the conductor film 251 in the through hole 241.

Note that, when the inner layer conductor pattern 233 is a power supply pattern, a power supply terminal of the die 111 may be electrically connected to the heat sink 112 to cause the heat sink 112 to function as a power supply terminal of the semiconductor package 102. Also in this case, the heat sink 112 and the joint portion 231a may be joined together with the solder 203.

As described above, according to the second embodiment, after the reflow step in the manufacturing steps is completed, heat conduction from the conductor pattern 271 of the heat dissipation pattern 232 to the conductor film 251 in the through hole 241 can be prevented to inhibit temperature rise inside the through hole 241. Therefore, the solder can be prevented from being drawn in the through hole 241.

Further, the residual heat remaining in the conductor pattern 271 is conducted via the conductor film 252 in the through hole 242 to the conductor land 262, but, due to the presence of the clearance 263, the heat is less liable to be conducted to the conductor pattern 261, and thus, the amount of the solder which is drawn in the through hole 242 can be reduced.

Therefore, occurrence of poor soldering between the heat sink 112 and the joint portion 231a can be reduced.

Further, steady heat generated when the semiconductor package 102 is operated is conducted to the solder 203, the conductor pattern 261 of the heat dissipation pattern 231, the conductor film 251, the inner layer conductor pattern 233, the conductor film 252, and the conductor pattern 271 of the heat dissipation pattern 232 in this order. Alternatively, heat conducted to the conductor pattern 261 of the heat dissipation pattern 231 is conducted to the conductor pattern 271 of the heat dissipation pattern 232 via the conductor films 253 and 254 in the respective through holes 243 and 244. Heat conducted to the conductor pattern 271 is dissipated from the conductor pattern 271 into the outside air. Therefore, heat dissipation of the semiconductor package 102 during its operation is not impaired.

Further, the through holes 241 and 242 are placed in the opposed region R1, and thus, the through holes 241 and 242 are close to each other, and the thermal resistance in the inner layer conductor pattern 233 is lowered and heat can be efficiently dissipated from the semiconductor package 102.

Further, not only the through hole 242 is placed in the opposed region R1, but also the through holes 243 and 244 are placed in the region R2, and thus, the heat dissipation is further improved compared with the case of the above-mentioned first embodiment.

Note that, in the second embodiment, a case is described in which the through hole 242 is formed in the opposed region R1, but the through hole 242 may be omitted and the through holes 243 and 244 which are the third through holes may be formed only in the region R2.

(Third Embodiment)

Figure 4A:
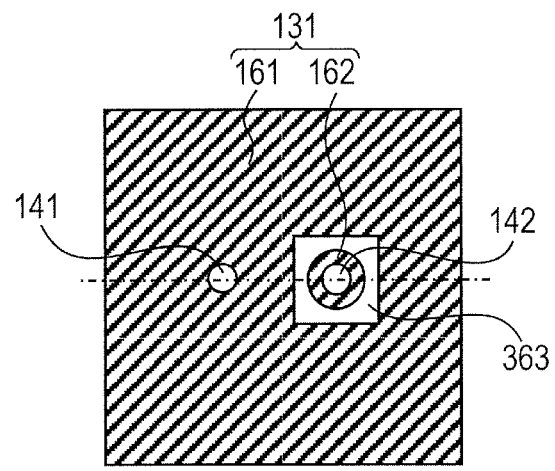
FIGS. 4A, 4B, and 4C are explanatory diagrams illustrating a schematic structure of a printed circuit board according to a third embodiment of the present invention.
Figure 4B:
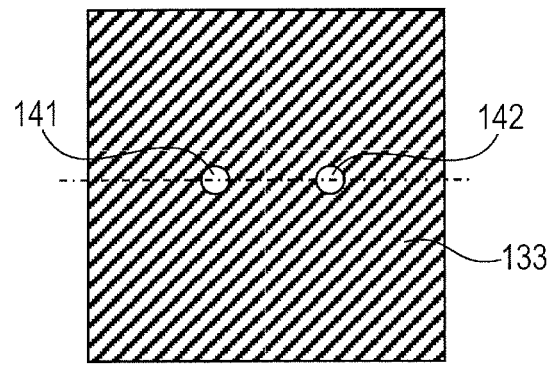
Figure 4C:
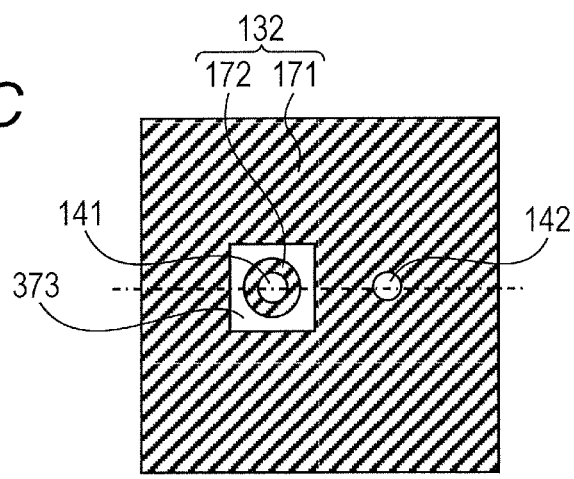

Next, a printed circuit board according to a third embodiment of the present invention is described. FIGS. 4A to 4C are explanatory diagrams illustrating a schematic structure of the printed circuit board according to the third embodiment of the present invention. FIG. 4A is a plan view of a first conductor pattern of a printed wiring board, FIG. 4B is a plan view of an inner layer conductor pattern of the printed wiring board, and FIG. 4C is a plan view of a second conductor pattern of the printed wiring board.

In the above-mentioned first embodiment, a case is described in which the clearance 163 corresponding to the through hole 142 is circular and the clearance 173 corresponding to the through hole 141 is circular, but the present invention is not limited thereto. As in the third embodiment, square clearances 363 and 373 illustrated in FIGS. 4A and 4C may be included. Specifically, it is enough that the clearances divide the plane-like conductive pattern 161 from the pad-like conductive pattern 162, and the plane-like conductive pattern 171 from the pad-like conductive pattern 172. The clearances may have any shape including a triangle, other than a circle and a square.

(Fourth Embodiment)

Figure 5A:
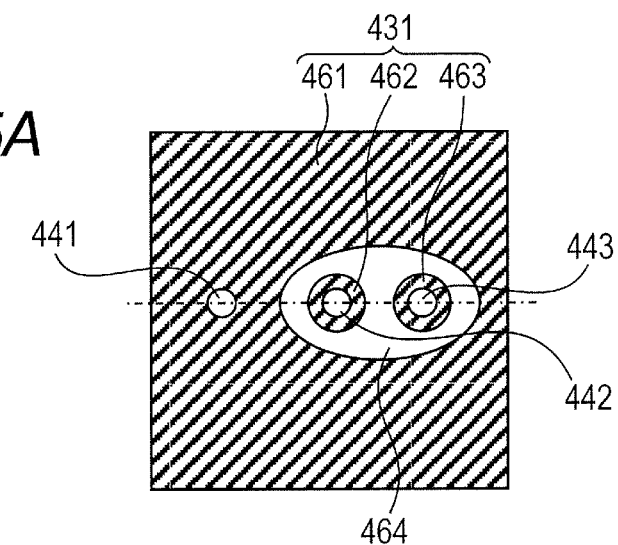
FIGS. 5A, 5B, and 5C are explanatory diagrams illustrating a schematic structure of a printed circuit board according to a fourth embodiment of the present invention.
Figure 5B:
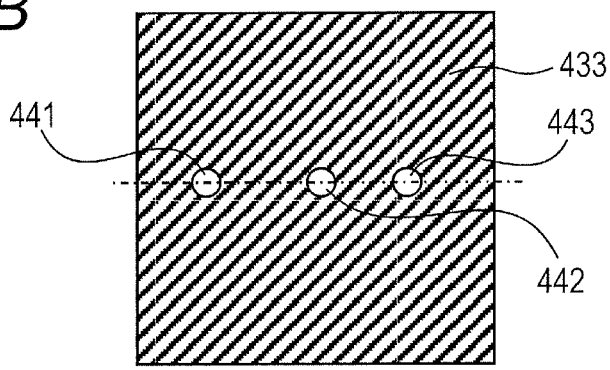
Figure 5C:
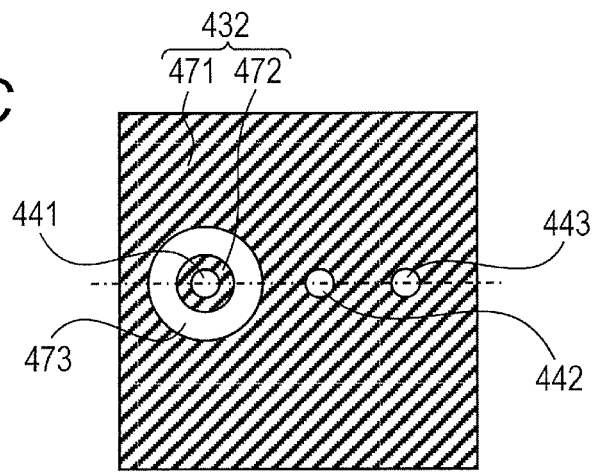

Next, a printed circuit board according to a fourth embodiment of the present invention is described. FIGS. 5A to 5C are explanatory diagrams illustrating a schematic structure of the printed circuit board according to the fourth embodiment of the present invention. FIG. 5A is a plan view of a first conductor pattern of a printed wiring board, FIG. 5B is a plan view of an inner layer conductor pattern of the printed wiring board, and FIG. 5C is a plan view of a second conductor pattern of the printed wiring board.

The number of the first through holes may be one or more. Further, the number of the second through holes may be one or more. It is preferred that the second through hole(s) be placed in the opposed region R1, but the second through hole(s) may be placed in the region R2 (FIGS. 3A to 3D) other than the opposed region R1.

Further, with regard to the heat dissipation effect of the semiconductor package 102, it is desired that the ratio between the number of the first through hole(s) and the number of the second through hole(s) be 1:1, but the present invention is not limited thereto. In FIGS. 5A to 5C, a case in which the ratio between the number of the first through holes and the number of the second through holes is 1:2 is illustrated. As illustrated in FIGS. 5A to 5C, the ratio between the number of through holes 441 as the first through holes and the number of through holes 442 and 443 as the second through holes may be 1:2.

In the fourth embodiment, as illustrated in FIG. 5A, a heat dissipation pattern 431 has, in a first surface layer, a solid conductor pattern 461 which is physically connected to a conductor film in the through hole 441. Further, the heat dissipation pattern 431 has, in the first surface layer, conductor lands 462 and 463 which are physically connected to conductor films in the through holes 442 and 443, respectively. A clearance 464 is provided between the conductor pattern 461 and the conductor lands 462 and 463, and hence the conductor pattern 461 and the conductor lands 462 and 463 are not held in contact with each other in the first surface layer. The conductor lands 462 and 463 have areas smaller than that of the conductor pattern 461.

Further, in the fourth embodiment, as illustrated in FIG. 5C, a heat dissipation pattern 432 has, in a second surface layer, a solid conductor pattern 471 which is physically connected to the conductor films in the respective through holes 442 and 443. Further, the heat dissipation pattern 432 has, in the second surface layer, a conductor land 472 which is physically connected to the conductor film in the through hole 441. A clearance 473 is provided between the conductor pattern 471 and the conductor land 472, and hence the conductor pattern 471 and the conductor land 472 are not held in contact with each other in the second surface layer. The conductor land 472 has an area smaller than that of the conductor pattern 471.

Further, an inner layer conductor pattern 433 is physically connected in an inner layer to the conductor films in the through holes 441, 442, and 443.

When there are multiple through holes (in this case, the second through holes) as the through holes 442 and 443 in the fourth embodiment, as illustrated in FIG. 5A, the clearance 464 may be shared by the multiple through holes 442 and 443.

Note that, the present invention is not limited to the embodiments described above, and various modifications can be made by those with an ordinary skill in the art within the technical idea of the present invention.

In the above-mentioned first to fourth embodiments, cases in which a conductor land which is connected to a conductor film in a through hole is formed and a heat dissipation pattern has a conductor pattern and a conductor land which are separated from each other are described. However, the conductor land may be omitted. In this case, a heat dissipation pattern and an end portion of a conductor film in a through hole are directly separated from each other.

Further, in the above-mentioned first to fourth embodiments, cases in which the printed wiring board is a three-layer printed wiring board are described, but the printed wiring board may have four or more layers.

According to the present invention, the second conductor pattern is formed in a pattern in which the end portion of the first conductor film on the second surface layer side is separated, and thus, conduction of heat due to the heating in the reflow step from the second conductor pattern to the first conductor film can be effectively reduced to inhibit temperature rise of the first conductor film. Therefore, inflow of the solder to the first through hole can be inhibited to reduce occurrence of poor soldering.

Further, heat generated of the semiconductor package during its operation is conducted to the solder, the first conductor pattern, the first conductor film, the inner layer conductor pattern, the second conductor film, and the second conductor pattern in this order, and is dissipated from the second conductor pattern into the outside air. Therefore, heat dissipation when the semiconductor package is operated is not impaired.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-175887, filed Aug. 8, 2012, which is hereby incorporated by reference herein in its entirety.

What is claimed is:

1. A printed circuit board comprising:
   a semiconductor package;
   a printed wiring board having the semiconductor package mounted on a first surface layer thereof,
   the printed wiring board comprising:
      a first conductor pattern formed in a region of the first surface layer on which the semiconductor package is to be mounted;
      a second conductor pattern placed in a second surface layer on a side opposite to the first surface layer;
      a first through hole piercing the first surface layer and the second surface layer; and
      a second through hole piercing the first surface layer and the second surface layer; and
   a solder member placed between the semiconductor package and the printed wiring board, for joining a conductive member provided in the semiconductor package and the first conductor pattern together, wherein:
   the first conductor pattern comprises:
      a first plane-like conductive pattern; and
      a first pad-like conductive pattern which is surrounded by the first plane-like conductive pattern and is placed with a gap between the first pad-like conductive pattern and the first plane-like conductive pattern;
   the second conductor pattern comprises:
      a second plane-like conductive pattern; and
      a second pad-like conductive pattern which is surrounded by the second plane-like conductive pattern and is placed with a gap between the second pad-like conductive pattern and the second plane-like conductive pattern;
   the first plane-like conductive pattern and the second pad-like conductive pattern are connected to each other via the first through hole; and
   the second plane-like conductive pattern and the first pad-like conductive pattern are connected to each other via the second through hole.

2. The printed circuit board according to claim 1, wherein the first plane-like conductive pattern is larger than the first pad-like conductive pattern, and the second plane-like conductive pattern is larger than the second pad-like conductive pattern.

3. The printed circuit board according to claim 1, wherein the first plane-like conductive pattern is formed in a region opposed to the semiconductor package.

4. The printed circuit board according to claim 1, wherein:
   the first plane-like conductive pattern and the first pad-like conductive pattern are formed in a region opposed to the semiconductor package; and
   the second plane-like conductive pattern is formed so as to extend beyond an outer peripheral region of the semiconductor package when the printed circuit board is seen from the semiconductor package side.

5. The printed circuit board according to claim 1, wherein the solder member is provided at least between the conductive member provided in the semiconductor package and the first plane-like conductive pattern, and in the second through hole.

6. The printed circuit board according to claim 1, wherein:
   an inner layer conductor pattern is formed in a region of an inner layer between the first surface layer and the second surface layer; and
   the first plane-like conductive pattern and the second plane-like conductive pattern are connected to each other via the first through hole, the inner layer conductor pattern, and the second through hole.

7. The printed circuit board according to claim 6, wherein the inner layer conductor pattern comprises any one of a power supply pattern electrically connected to a power supply terminal of the semiconductor package and a ground pattern electrically connected to a ground terminal of the semiconductor package.

8. A printed wiring board for mounting a semiconductor package thereon, comprising:
  a first conductor pattern formed in a region of a first surface layer on which the semiconductor package is to be mounted;
  a second conductor pattern placed in a second surface layer on a side opposite to the first surface layer;
  a first through hole piercing the first surface layer and the second surface layer; and
  a second through hole piercing the first surface layer and the second surface layer, wherein:
  the first conductor pattern comprises:
    a first plane-like conductive pattern; and
    a first pad-like conductive pattern which is surrounded by the first plane-like conductive pattern and is placed with a gap between the first pad-like conductive pattern and the first plane-like conductive pattern;
  the second conductor pattern comprises:
    a second plane-like conductive pattern; and
    a second pad-like conductive pattern which is surrounded by the second plane-like conductive pattern and is placed with a gap between the second pad-like conductive pattern and the second plane-like conductive pattern;
  the first plane-like conductive pattern and the second pad-like conductive pattern are connected to each other via the first through hole; and
  the second plane-like conductive pattern and the first pad-like conductive pattern are connected to each other via the second through hole.

9. The printed wiring board according to claim 8, wherein the first plane-like conductive pattern is larger than the first pad-like conductive pattern, and the second plane-like conductive pattern is larger than the second pad-like conductive pattern.

10. The printed wiring board according to claim 8, wherein the first plane-like conductive pattern is formed in a region on which the semiconductor package is to be mounted.

11. The printed wiring board according to claim 8, wherein:
  the first plane-like conductive pattern and the first pad-like conductive pattern are formed in a region on which the semiconductor package is to be mounted; and
  the second plane-like conductive pattern is formed so as to extend beyond an outer peripheral region of the region on which the semiconductor package is to be mounted, when the printed wiring board is seen from the first surface layer side.

12. The printed wiring board according to claim 8, wherein:
  an inner layer conductor pattern is formed in a region of an inner layer between the first surface layer and the second surface layer; and
  the first plane-like conductive pattern and the second plane-like conductive pattern are connected to each other via the first through hole, the inner layer conductor pattern, and the second through hole.

13. The printed wiring board according to claim 12, wherein the inner layer conductor pattern comprises any one of a power supply pattern electrically connected to a power supply terminal of the semiconductor package and a ground pattern electrically connected to a ground terminal of the semiconductor package.

14. A method of manufacturing a printed circuit board, comprising:
  applying a solder paste to the first conductor pattern of the printed wiring board according to claim 8;
  placing the semiconductor package so that a conductive member of the semiconductor package formed on a surface opposed to the printed wiring board is located on the solder paste, and, by heating the solder paste, to move the solder paste placed between the first pad-like conductive pattern of the first conductor pattern and the conductive member into the second through hole under a state in which a connected state between the first plane-like conductive pattern of the first conductor pattern and the conductive member is maintained via the solder paste; and
  cooling the heated solder paste.

* * * * *